US012334399B2

(12) United States Patent
Wang et al.

(10) Patent No.: US 12,334,399 B2
(45) Date of Patent: Jun. 17, 2025

(54) STRUCTURES AND METHODS FOR FABRICATING STAIRCASE REGIONS OF A THREE-DIMENSIONAL NAND MEMORY DEVICE (71) Applicant: Yangtze Memory Technologies Co., Ltd., Hubei (CN)

(72) Inventors: Xiongyu Wang, Wuhan (CN); Yi Zhou, Wuhan (CN); Li Zhang, Wuhan (CN); XinSheng Wang, Wuhan (CN); Hsing-An Lo, Wuhan (CN); GaoSheng Zhang, Wuhan (CN); YuPing Xia, Wuhan (CN); Fei Xie, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 686 days.

(21) Appl. No.: 17/451,188

(22) Filed: Oct. 18, 2021

(65) Prior Publication Data
US 2023/0068091 A1    Mar. 2, 2023

Related U.S. Application Data (63) Continuation of application No. PCT/CN2021/115315, filed on Aug. 30, 2021.

(51) Int. Cl.
*H01L 21/768* (2006.01)
*H01L 21/02* (2006.01)
(Continued)

(52) U.S. Cl.
CPC .... *H01L 21/76895* (2013.01); *H01L 21/0217* (2013.01); *H01L 21/02211* (2013.01);
(Continued)

(58) Field of Classification Search
CPC .......... H01L 21/76895; H01L 21/0217; H01L 21/02211; H01L 21/02271;
(Continued)

(56) References Cited

U.S. PATENT DOCUMENTS 9,520,402 B1 *  12/2016  Haller ................. H01L 23/528
2002/0027286 A1 *  3/2002  Sundararajan .... H01L 21/02167
                                                257/E21.27
(Continued)

FOREIGN PATENT DOCUMENTS

CN    111952319 A    11/2020

OTHER PUBLICATIONS

Machine Translation of CN 111952319. (Year: 2020).*
(Continued)

*Primary Examiner* — Britt D Hanley
*Assistant Examiner* — Vicki B. Booker
(74) *Attorney, Agent, or Firm* — Oblon, McClelland, Maier & Neustadt, L.L.P.

(57) ABSTRACT

In a method for fabricating a semiconductor device, a stack of alternating insulating layers and sacrificial layers are formed over a substrate. A staircase having a plurality of steps are formed in the stack. Each of the steps has a tread and a riser and further includes a respective pair of the insulating layer and the sacrificial layer over the insulating layer of the respective step. A dielectric layer is formed along the treads and risers of the steps and is doped with one or a combination of carbon, phosphorous, boron, arsenic, and oxygen. The sacrificial layers are further replaced with a conductive material to form word line layers that are arranged between the insulating layers. A plurality of word line contacts are formed to extend from the word line layers of the plurality of steps, and further extend through the dielectric layer.

18 Claims, 7 Drawing Sheets (51) Int. Cl.
*H01L 23/522* (2006.01)
*H01L 23/528* (2006.01)
*H01L 23/535* (2006.01)
*H10B 41/27* (2023.01)
*H10B 43/27* (2023.01)

(52) U.S. Cl.
CPC .. *H01L 21/02271* (2013.01); *H01L 21/76829* (2013.01); *H01L 21/76877* (2013.01); *H01L 23/5226* (2013.01); *H01L 23/5283* (2013.01); *H01L 23/535* (2013.01); *H10B 41/27* (2023.02); *H10B 43/27* (2023.02)

(58) Field of Classification Search
CPC ......... H01L 21/76829; H01L 21/76877; H01L 23/5226; H01L 23/5283; H01L 23/535; H10B 41/27; H10B 41/50; H10B 41/20; H10B 43/27; H10B 43/50; H10B 43/35; H10B 43/20
See application file for complete search history.

(56) References Cited

U.S. PATENT DOCUMENTS

| | | | |
|---|---|---|---|
| 2007/0082507 A1* | 4/2007 | Iyer | C23C 16/345 438/795 |
| 2015/0054143 A1* | 2/2015 | Chuang | H01L 31/1868 438/763 |
| 2017/0117222 A1* | 4/2017 | Kim | H01L 23/5283 |
| 2019/0067306 A1* | 2/2019 | Fang | H10B 41/20 |
| 2019/0096810 A1* | 3/2019 | Zhu | H01L 23/535 |

OTHER PUBLICATIONS

International Search Report issued May 20, 2022 in PCT/CN2021/115315 (submitting English translation only), 4 pages.

* cited by examiner

STRUCTURES AND METHODS FOR FABRICATING STAIRCASE REGIONS OF A THREE-DIMENSIONAL NAND MEMORY DEVICE

RELATED APPLICATION

This application is a bypass continuation of International Application No. PCT/CN2021/115315, filed on Aug. 30, 2021. The entire disclosure of the prior application is hereby incorporated by reference in its entirety.

BACKGROUND

Flash memory devices have recently been through a rapid development. The flash memory devices are able to retain the stored data for a long period of time without applying a voltage. Further, the reading rate of the flash memory devices is relatively high, and it is easy to erase stored data and rewrite data into the flash memory devices. Thus, the flash memory devices have been widely used in microcomputers, automatic control systems, and the like. To increase the bit density and reduce the bit cost of the flash memory devices, three-dimensional (3D) NAND (Not AND) flash memory devices have been developed. The 3D-NAND memory device can include an array region and staircase regions that are coupled to the array region. The staircase regions can have a plurality of steps. A plurality of word line contacts can further extend from the steps of the staircase regions and be coupled to the memory cells in the array region.

SUMMARY

The present disclosure describes embodiments generally related to structures and methods for fabricating staircase regions of a 3D-NAND memory device.

According to an aspect of the disclosure, a method for fabricating a semiconductor device is provided. In the method, a stack of alternating insulating layers and sacrificial layers can be formed over a substrate. A staircase having a plurality of steps can be formed in the stack, where each of the plurality of steps can have a tread and a riser and further include a respective pair of the insulating layer and the sacrificial layer over the insulating layer of the respective step. A dielectric layer can be formed along the treads and the risers of the plurality of steps. The dielectric layer can be doped with one or a combination of carbon, phosphorous, boron, arsenic, and oxygen. The sacrificial layers can further be replaced with a conductive material to form word line layers that are arranged between the insulating layers. A plurality of word line contacts can be formed to extend from the word line layers of the plurality of steps, and further extend through the dielectric layer.

In an example, in order to replace the sacrificial layers, the sacrificial layers can be removed to form spaces between the insulating layers, and the conductive material can further be filled in the spaces to form the word line layers between the insulating layers.

In another example, in order to replace the sacrificial layers, the sacrificial layers and a portion of the dielectric layer that is in contact with the sacrificial layers can be removed to form spaces between the insulating layers. The conductive material can subsequently be filled in the spaces to form the word line layers between the insulating layers.

In some embodiments, in each of the plurality of steps, the word line layer can extend further into the dielectric layer than the insulating layer in a direction parallel to the substrate, and a portion of the word line layer covered by the insulating layer of an overlying step of the plurality of steps can have a smaller thickness than a portion of the word line layer at the tread.

In an example of the method, in order to form the dielectric layer, a SiN layer can be formed. The SiN layer can be doped with the one or the combination of carbon, phosphorous, boron, arsenic, and oxygen.

In another example of the method, in order to form the dielectric layer, a SiN layer can be formed. The SiN layer can be doped with carbon by processing gases including tetramethylsilane and $NH_3$.

In yet another example of the method, in order to form the dielectric layer, a SiN layer can be formed. The SiN layer can be doped with oxygen by processing gases including $SiH_4$ and $N_2O$.

In the method, each of the plurality of word line contacts can extend from a respective word line layer at the treads of the plurality of steps, and further extend through the dielectric layer in a direction perpendicular to the substrate.

In the method, in order to replace the sacrificial layers, the sacrificial layers can be removed by an etching process, where the dielectric layer can have a lower etch rate than the sacrificial layers in the etching process.

In order to form the stack of alternating insulating layers and sacrificial layers, the insulating layers that include SiO and the sacrificial layers that include SiN can be deposited alternatingly on the substrate so that the sacrificial layers are disposed between the insulating layers.

According to another aspect of the disclosure, a semiconductor device is provided. The semiconductor device can include a stack of alternating insulating layers and word line layers over a substrate, and a staircase formed in the stack having a plurality of steps. Each of the plurality of steps can have a tread and a riser and further include a respective pair of the insulating layer and the word line layer over the insulating layer of the respective step. In the semiconductor device, a dielectric layer can be formed along the treads and the risers of the plurality of steps, where the dielectric layer can be doped with one or a combination of carbon, phosphorous, boron, arsenic, and oxygen. The semiconductor device can further include a plurality of word line contacts that extend from the word line layers of the plurality of steps, and further extend through the dielectric layer.

In some embodiments, in each of the plurality of steps, the word line layer can extend further into the dielectric layer than the insulating layer in a direction parallel to the substrate, and a portion of the word line layer covered by the insulating layer of an overlying step of the plurality of steps can have a smaller thickness than a portion of the word line layer at the tread.

In an example, the dielectric layer can include a SiN layer that is doped with the one or the combination of carbon, phosphorous, boron, arsenic, and oxygen.

In another example, the dielectric layer can include a SiN layer that is doped with carbon by processing gases including tetramethylsilane and $NH_3$.

In yet another example, the dielectric layer can include a SiN layer that is doped with oxygen by processing gases including $SiH_4$ and $N_2O$.

In some embodiments, each of the plurality of word line contacts can extend from a respective word line layer at the treads of the plurality of steps, and further extend through the dielectric layer in a direction perpendicular to the substrate.

According to yet another aspect of the disclosure, a method for fabricating a semiconductor device is provided. In the method, a stack of alternating oxide layers and first nitride layers can be formed over a substrate. The stack can be etched to form a staircase having a plurality of steps in the stack, where each of the plurality of steps can have a tread and a riser and further include a respective pair of the oxide layer and the nitride layer over the oxide layer of the respective step. A second nitride layer can be formed along the treads and the risers of the plurality of steps. The second nitride layer can be doped with one or a combination of carbon, phosphorous, boron, arsenic, and oxygen. The first nitride layers can be removed by an etching process to form spaces between the oxide layers. The spaces can be filled with a conductive material to form word line layers that are arranged between the oxide layers. A plurality of word line contacts can be formed to extend from the word line layers of the plurality of steps, and further extend through the second nitride layer.

In order to remove the first nitride layers, the first nitride layers and a portion of the second nitride layer that is in contact with the first nitride layers can be removed to form the spaces between the oxide layers.

In some embodiments, in each of the plurality of steps, the word line layer can extend further into the second nitride layer than the oxide layer in a direction parallel to the substrate, and a portion of the word line layer covered by the insulating layer of an overlying step of the plurality of steps can have a smaller thickness than a portion of the word line layer at the tread.

In order to form the second nitride layer, in an example, a SiN layer that is doped with carbon can be formed by processing gases including tetramethylsilane and $NH_3$. In another example, a SiN layer that is doped with oxygen can be formed by processing gases including $SiH_4$ and $N_2O$.

BRIEF DESCRIPTION OF THE DRAWINGS

Aspects of the present disclosure can be understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In order to form a 3D-NAND memory device, a stack of alternating oxide layers and sacrificial layers (e.g., SiN layers) can be formed over a substrate. A staircase including a plurality of steps can be formed in the stack. The sacrificial layers can be subsequently removed, such as by a wet etch, and replaced with a conductive material to form word line layers that are arranged between the oxide layers. A plurality of word line contacts can further be formed to land on the word line layers at the steps of the staircase. With the development of the 3D-NAND memory device, a height of the stack is increasing, and a challenge of a landing window of the word line contacts to land on the word lines layer at the steps is also increasing. For example, the word line contacts may extend through (or punch through) the word line layers at the steps if the landing window is small. In order to increase the landing window, in a related example, two SiN layers can be selectively deposited on the steps through an atomic layer deposition (ALD). The selectively deposited SiN layers and the sacrificial layers can further be replaced concurrently with the conductive material to form the word line layers. Thus, the word line layers can have a larger thickness at the steps in the staircase, and the word line contacts can be prevented from punching through the word line layers at the steps.

However, in the related example stated above, a high standard is required to control the selective formation of the SiN layers. For example, precise controls are required to control a film difference between the SiN layers on an upper step and a lower step in the staircase, a step profile angle of the steps, and a concentration/etching time of the wet etch, which in turn brings more challenges and difficulties to subsequent manufacturing processes.

In the present disclosure, in order to increase the landing window of the word line contacts, a processing gas precursor containing one or a combination of elements, such as a carbon element, a phosphorus element, a arsenic element, and an oxygen element, can be applied to dope the SiN layers in the selective SiN deposition process. The doped SiN layers can have a much lower etch rate than the sacrificial layers. For example, a carbon doped SiN can have a much lower etch rate than the sacrificial layers made of SiN in a phosphorus acid (H$_3$PO$_4$). Thus, in the subsequent removal of the sacrificial layers (e.g., SiN layers), the selectively deposited SiN layers can be retained on the steps of the staircase. The selectively deposited SiN layers can function as etch stop layers to prevent the word line contacts from punching through the word line layers at the steps. Accordingly, it can be much easier to control the manufacturing process of forming the staircase region in the 3D-NAND memory device.

Figure 1:
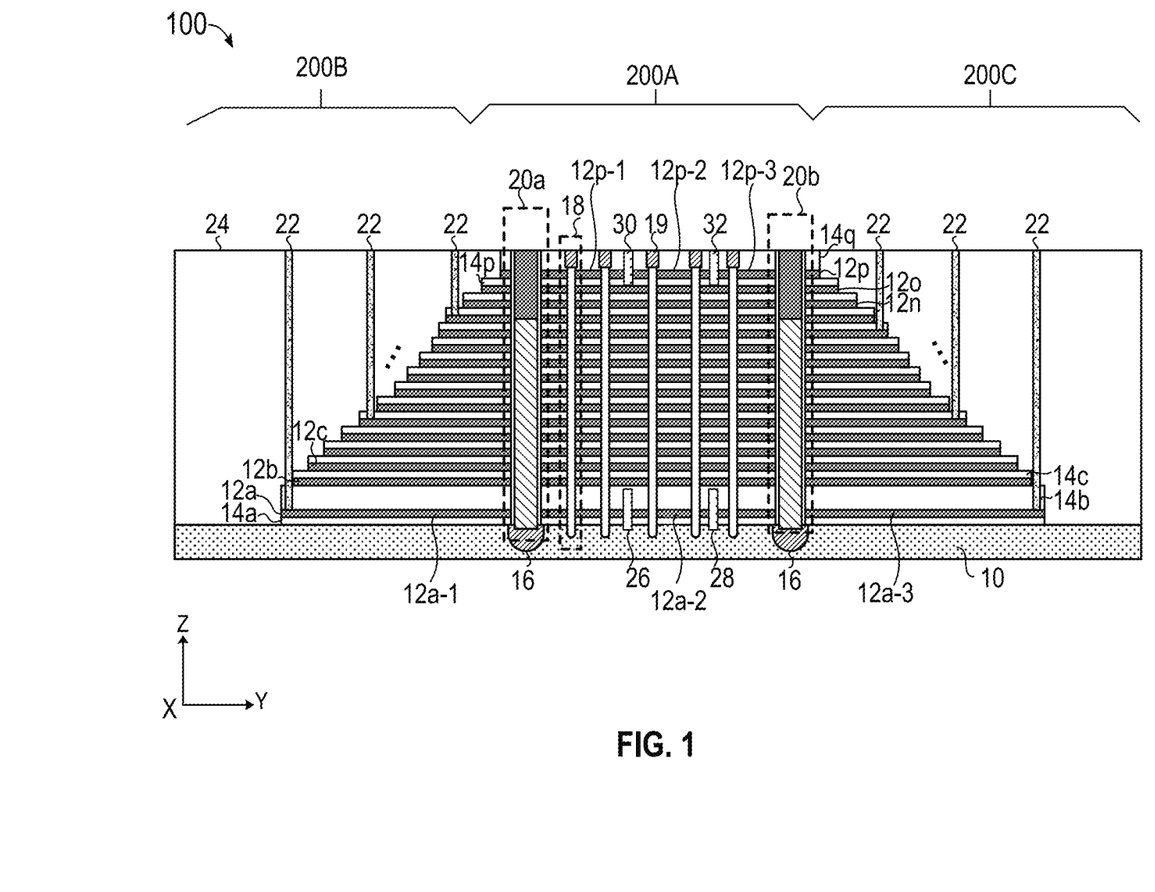
FIG. 1 is a cross-sectional view of a 3D-NAND memory device, in accordance with exemplary embodiments of the disclosure.

FIG. 1 is an exemplary embodiment of a 3D-NAND memory device (or device) 100. As shown in FIG. 1, the device 100 can include an array region 200A and staircase regions 200B-200C that are arranged in a dielectric layer 24. The array region 200A can be arranged between the staircase regions 200B-200C, and formed in a stack of alternating word line layers 12a-12p and insulating layers 14a-14q over a substrate 10. The word line layers 12a-12p can include one or more bottom select gate (BSG) layers, gate layers (or word line layers), and one or more top select gate (TSG) layers that are arranged sequentially over the substrate 10. For example, the word line layer 12a can be a BSG layer, and the word line layer 12p can be a TSG layer in the device 100.

In some embodiments, the device 100 can include one or more bottom dielectric trenches (e.g., 26 and 28) that are formed in the one or more BSGs (e.g., in the word line layer 12a). The bottom dielectric trenches 26 and 28 can extend in an X-direction of the substrate 10 to separate the BSGs into a plurality of sub-BSGs (e.g., 12a-1, 12a-2, and 12a-3). In addition, one or more top dielectric trenches (e.g., 30 and 32) can be formed in the one or more TSGs (e.g., in the word line layer 12p). The top dielectric trenches 30 and 32 can also extend in the X-direction of the substrate 10 to separate the TSGs into a plurality of sub-TSGs (e.g., 12p-1, 12p-2, and 12p-3). The sub-BSGs and sub-TSGs can divide the device 100 into a plurality of sub-blocks. Each of the sub-blocks can have a respective sub-BSG and a respective sub-TSG. Thus, memory cells strings in a corresponding sub-block can be operated individually through controlling the respective sub-BSG and respective sub-TSG.

The array region 200A can include a plurality of channel structures 18. Each of the channel structures 18 can include a respective top channel contact 19. Each of the channel structure 18 can extend through the stack and be coupled to the word line layers 12a-12p to form a respective vertical NAND memory cell string. The vertical NAND memory cell string can include one or more bottom select transistors (BSTs), a plurality of memory cells (MCs), and one or more top select transistors (TSTs) that are disposed sequentially and in series over the substrate along a height direction (e.g., Z direction) of the substrate 10. The one or more BSTs can be formed of the channel structure and the one or more BSG layers, the MCs can be formed of the channel structure and the word line layers, and the one or more TSTs can be formed of the channel structure and the one or more TSG layers.

In the device 100, each of the memory cells can store one or more logic bits, according to the device designs. For example, the memory cells can be single level cells (SLCs), multiple level cells (MLCs), or triple level cells (TLCs). Accordingly, each of the memory cells can store one logic bit, two logic bits, or three logic bits.

Still referring to FIG. 1, the word line layers 12a-12p can be formed in a stair-cased configuration in the staircase regions 200B and 200C, and a plurality of word line contacts 22 can be formed along the height direction and coupled to the word line layers 12a-12p. Thus, gate voltages can be applied on gates of the memory cells through the word line contacts 22 that are coupled to the word line layers 12a-12p.

In addition, each of the channel structures can further be coupled to a respective bit line (or bit line structure). In some embodiments, the bit line can be connected to the top channel contact 19 of the channel structure 18, and configured to apply a bias voltage when operating the channel structure, such as programming, erasing, or reading the channel structure. The device 100 can have a plurality of slit structures (or gate line slit structures). For example, two slit structures 20a-20b are included in FIG. 1. The slit structures 20a-20b can be made of conductive materials and positioned on array common source (ACS) regions 16 to serve as contacts. The ACS regions are formed in the substrate 10 to serve as common sources of the device 100.

Figure 2A:
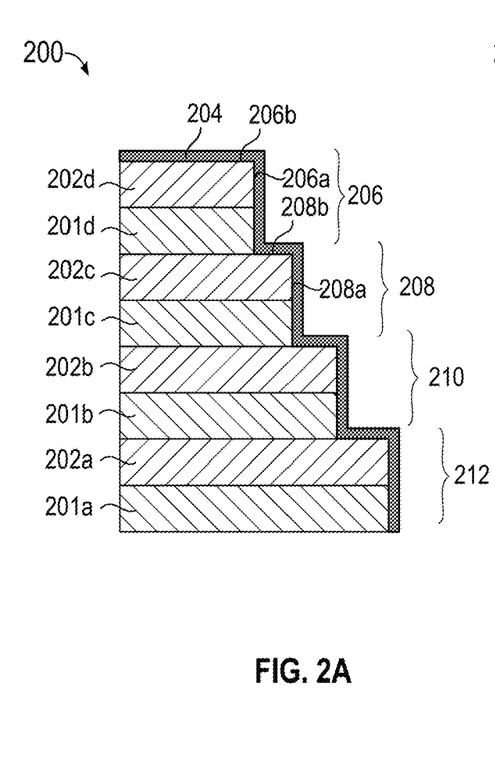
FIGS. 2A, 2B, and 2C are cross-sectional views of forming a staircase region in a related 3D-NAND memory device, in accordance with exemplary embodiments of the disclosure.
Figure 2B:
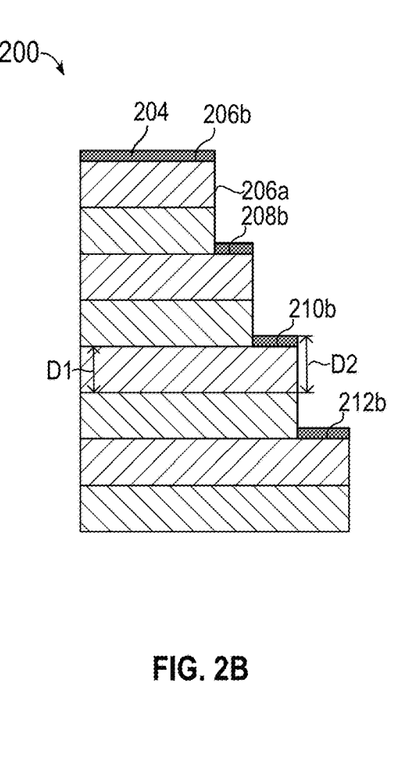
Figure 2C:
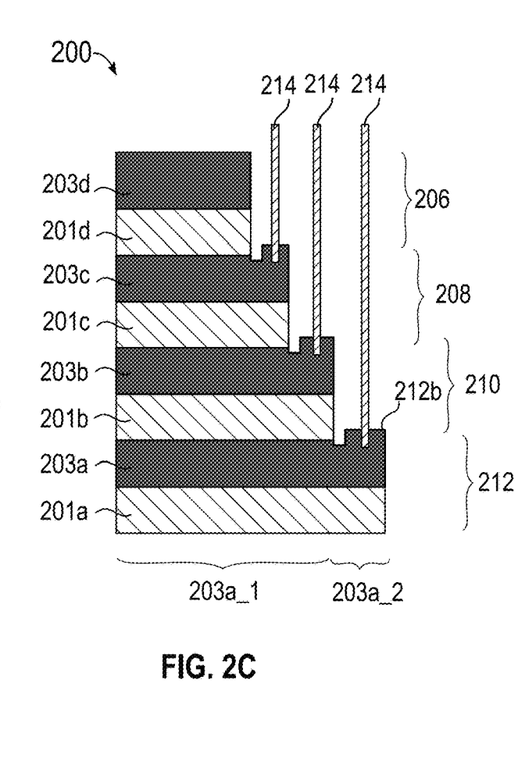

FIGS. 2A, 2B, and 2C are cross-sectional views of forming a staircase region 200 in a related 3D-NAND memory device. As shown in FIG. 2A, in the staircase region 200, a stack of alternating insulating layers 201a-201d and sacrificial layers 202a-202d are formed over a substrate (not shown). In an exemplary embodiment of FIG. 2A, the insulating layers 201a-201d can be oxide layers (e.g., SiO layer) and the sacrificial layers 202a-202d can be SiN layers. In addition, a plurality of steps 206-212 can be formed in the stack. Each of the steps 206-212 can include a respective pair of an insulating layer and a sacrificial layer, where the sacrificial layer is positioned over the insulating layer. For example, the step 206 can include the insulating layer 201d and the sacrificial layer 202d that is positioned over the insulating layer 201d. Each of the steps 206, 208, 210, and 212 can include a tread and a riser. For example, the step 206 can include a tread 206b and a riser 206a. The step 208 can include a tread 208b and a riser 208a. Further, a dielectric layer 204 can be formed along the steps and cover the treads and risers of the steps. The dielectric layer 204 can include SiO, SiN, or the like. In an exemplary embodiment of FIG. 2A, the dielectric layer 204 can be SiN.

In FIG. 2B, a selective etching process can be performed to remove portions of the dielectric layer 204 that are formed along the risers of the steps 206, 208, 210, and 212, and portions of the dielectric layer 204 formed on the treads 206b, 208b, 210b, and 212b are retained.

In FIG. 2C, the sacrificial layers 202a-202d and the portions of the dielectric layer 204 remains on the treads 206b, 208b, 210b, and 212b can be removed by an etching process. Spaces (not shown) can be accordingly formed between the insulating layers 201a-201d. Each of the spaces can have a first portion with a first height D1 measured between two adjacent insulating layers and a second portion with a second height D2 measured at a tread of a corresponding step. The first height D1 can be approximately equal to a thickness of a corresponding sacrificial layer that is removed. The second height D2 at the tread can be equal to the thickness of the corresponding sacrificial layer plus a thickness of the portion of the dielectric layer 204 on the tread. Thus, the second height D2 can be larger than the first height D1. A conductive material, such as W, Co, Ru, or the like, can be subsequently deposited to fill in the spaces. Accordingly, a plurality of word line layers 203a-203d can be formed that are spaced apart from one another by the insulating layers 201a-201d.

Still referring to FIG. 2C, each of the word line layers 203a-203c can have a first portion between two adjacent insulating layers and a second portion at a corresponding tread. The first portion of the word line can be formed by filling the first portion of the space with the conductive material and the second portion of the word line can be formed by filling the second portion of the space with the conductive material. As mentioned above, the first portion of the space can have the first height D1 and the second portion of the space can have the second height D2, where the D1 is smaller than D2. Accordingly, the first portion of the word line layer is thinner than the second portion of the word line layer. For example, the word line layer 203a has a second portion 203a_2 at the tread 212b that is thicker than a first portion 203a_1 positioned between the two adjacent insulating layers 201a and 201b. A plurality of word line contacts 214 can be formed to extend from the treads of the steps 208, 210, and 212. The word line contacts 214 can further extend into the word line layers 203a-203c at the treads. In the related 3D-NAND memory device, the thickness of the word line layers 203a-203c at the treads of the steps 206, 208, 210, and 212 can be increased, which in turn prevents the word line contacts 214 from punching through the word line layers 203a-203c.

As stated above, in order to form the structure of FIG. 2C, a high standard of the process control is required to control the selective formation of the SiN layer (e.g., 204) on the treads of the steps. For example, a precise etch is required to remove the SiN layer on the risers, the angle of the step profile for the steps is required to be close to 90 degree, and the concentration/etching time of the wet etch is required to be in a small range, which in turn brings more challenges and difficulties to subsequent manufacturing processes.

Figure 3A:
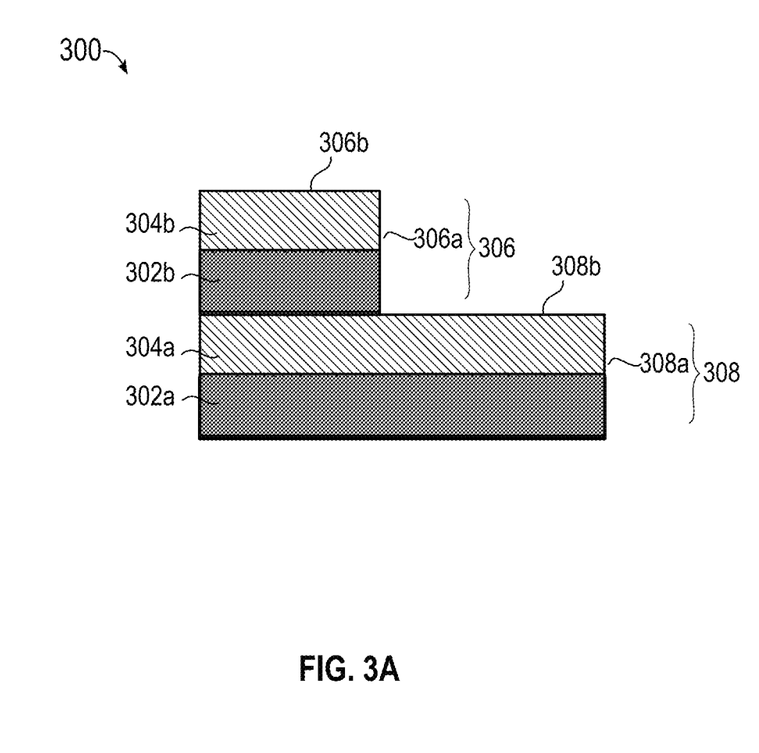
FIGS. 3A, 3B, 3C, and 3D are cross-sectional views of various intermediate steps of manufacturing a staircase region of a 3D-NAND memory device, in accordance with exemplary embodiments of the disclosure.

FIGS. 3A, 3B, 3C, and 3D are cross-sectional views of various intermediate steps of manufacturing a staircase region 300 of a 3D-NAND memory device. As shown in FIG. 3A, in the staircase region 300, a stack of alternating insulating layers 302a-302b and sacrificial layers 304a-304b are formed over a substrate (not shown). In addition, a plurality of steps 306-308 can be formed in the stack. Each of the steps 306 and 308 can include a respective pair of an insulating layer and a sacrificial layer, where the sacrificial layer is positioned over the insulating layer. For example, the step 306 can include the insulating layer 302b and the sacrificial layer 304b that is positioned over the insulating layer 302b. Each of the steps 306 and 308 can include a tread and a riser. For example, the step 306 can include a tread 306b and a riser 306a. The step 308 can include a tread 308b and a riser 308a. It should be noted that FIG. 3A is just an example. The stack can include any number of insulating layers and sacrificial layers, and any number of steps can be formed in the stack accordingly.

In an exemplary embodiment of FIG. 3A, the insulating layers 302a-302b can be silicon oxide (SiO) layers and the sacrificial layers 304a-304b can be silicon nitride (SiN) layers. Of course, the insulating layers and the sacrificial layers can include any suitable dielectric materials. The insulating layers and the sacrificial layers can be formed by a suitable deposition process, such as a chemical vapor deposition (CVD), a physical vapor deposition (PVD), an atomic layer deposition (ALD), a thermal oxidation, an e-beam evaporation, a sputtering, a diffusion, or any combination thereof.

Figure 3B:
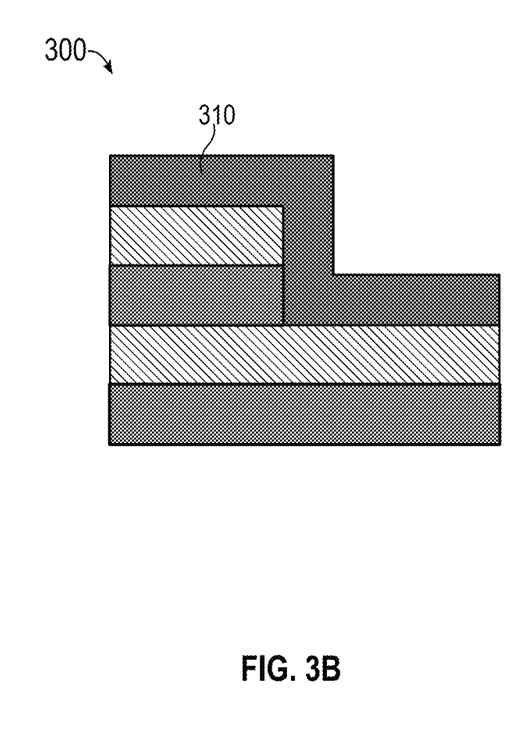

In FIG. 3B, a dielectric layer 310 can be selectively formed along the steps and cover the treads and risers of the steps. The dielectric layer 310 can include SiO, SiN, or other suitable dielectric materials. In an exemplary embodiment of FIG. 3A, the dielectric layer 310 can be SiN that is doped with one or a combination of carbon (C), phosphorous (P), boron (B), arsenic (Ar), and oxygen (O). The dielectric layer 310 can be formed by any suitable deposition techniques, such as the ALD, a plasma-enhanced CVD, or the like. In order to form the doped SiN, a processing gas precursor containing one or a combination of a carbon element, a phosphorus element, an arsenic element, and an oxygen element can be applied to form the doped SiN. Accordingly, in an example, a SiN layer 310 that is doped with carbon can be formed by processing gases including tetramethylsilane ($C_4H_{12}Si$) and $NH_3$. In another example, a SiN layer 310 that is doped with oxygen can be formed by processing gases including $SiH_4$ and $N_2O$. In yet another example, a SiN layer 310 that is doped with phosphorus and/or boron can be formed. In yet another example, a SiN layer 310 that is doped with carbon and oxygen can be formed by processing gases including $SiH_4$, $N_2O$, and $C_2F_6$. In yet another example, a SiN layer 310 that is doped with one or a combination of P, B, or Ar can be formed.

It should be noted that, in the example of FIG. 3B, the dielectric layer 310 is a silicon nitride based dielectric layer that is doped with one of the combination of the C, P, B, O, and Ar. Thus, the doped element (e.g., C, P, B, O, and Ar) has a less atomic concentration than the silicon nitride in the dielectric layer 310.

Figure 3C:
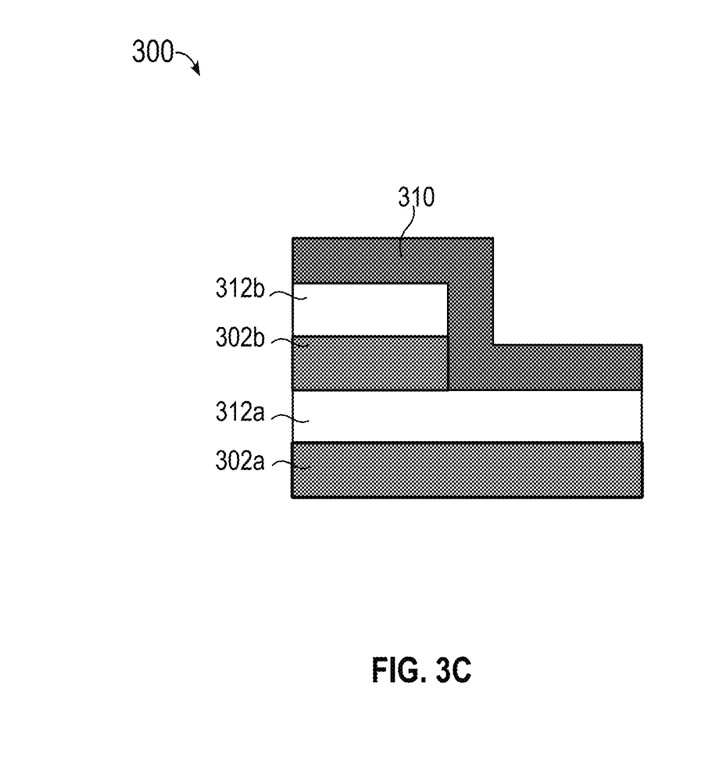

In FIG. 3C, the sacrificial layers 304a-304b can be removed by an etching process, such as a wet etch. The wet etch can apply a wet acid to remove the sacrificial layers 304a-304b and form spaces (not shown) between the insulating layers 302a-302b. In an example of FIG. 3C, the wet acid can be $H_3PO_4$ acid. The doped SiN layer 310 can have an etch rate that is lower than the sacrificial layers 304a-304b in the wet acid. Thus, in the removal of the sacrificial layers 304a-304b, the doped SiN layer 310 can be retained on the steps of the staircase. Further, a conductive material can be filled in the spaces to form a plurality of word line layers 312a-312b that are spaced apart from each other by the insulating layers 302a-302b. In an example of FIG. 3C, the conductive material can include tungsten (W), cobalt (Co), ruthenium (Ru), or the like.

Figure 3D:
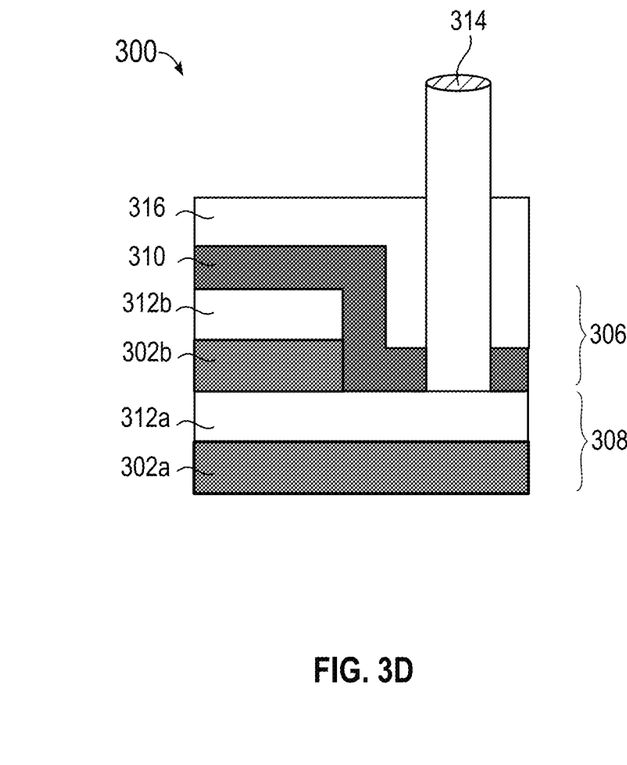

In FIG. 3D, a plurality of word line contacts can be formed to extend from the word line layers at the steps and further extend through the dielectric layer 310. As shown in FIG. 3D, an exemplary word line contact 314 is formed to land on the word line layer 312a and extends through the dielectric layer 310. The doped SiN layer 310 positioned on steps (e.g., 306 and 308) can function as an etch stop layer to prevent the word line contacts (e.g., 314) from punching through the word line layers (e.g., 312a) at the steps. Accordingly, it can be much easier to control the manufacturing process of forming the staircase region 300.

Still referring to FIG. 3D, in order to form the word line contacts (e.g., 314), an interlayer dielectric (ILD) 316 can be formed to cover the steps 306 and 308. A patterning process can further be applied to form contact openings (not shown) in the ILD 316. The patterning process can include a photolithography process to form a patterned mask including patterns and an etching process to transfer the patterns of the patterned mask into the ILD 316 so as to form the contact openings. The etching process can further etch through the doped SiN layer 310 to expose the word line layers (e.g., 312a). The contact openings can further be filled by a conductive material in a deposition process, such as the CVD, the PVD, the ALD, the diffusion, or the like. The conductive material can include W, Co, Ru, Cu, Al, or the like.

Figure 4:
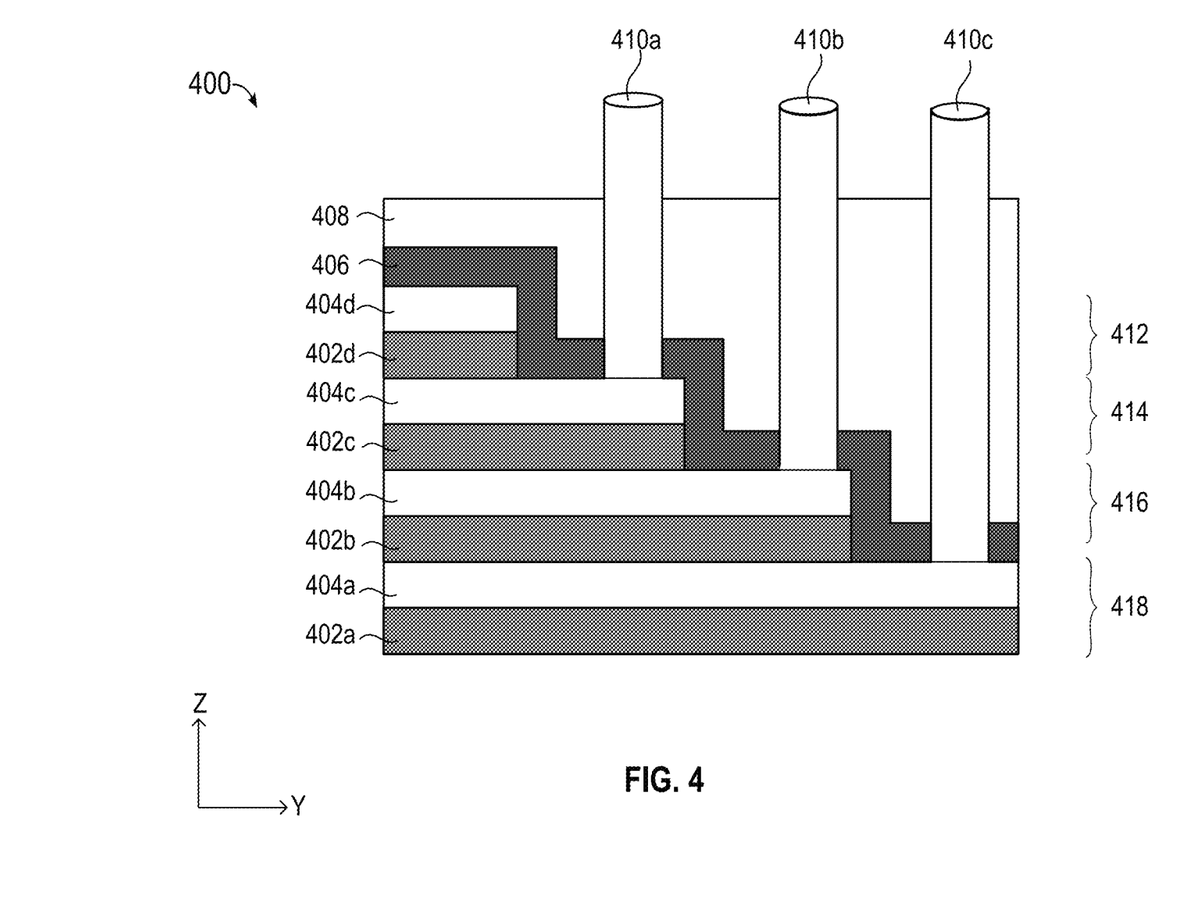
FIG. 4 is a cross-sectional view of a first exemplary staircase region of a 3D-NAND memory device, in accordance with exemplary embodiments of the disclosure.

FIG. 4 illustrates a cross-sectional view of a first exemplary staircase region 400 of a 3D-NAND memory device, which can be formed based on the manufacturing process in FIGS. 3A-3D. As shown in FIG. 4, the staircase region 400 can be formed in a stack of alternating insulating layers 402a-402d and word line layers 404a-404d and include a plurality of steps 412, 414, 416, and 418. Each of the plurality of steps 412, 414, 416, and 418 can include a respective pair of an insulating layer and a word line layer. For example, the step 412 can include the insulating layer 402*d* and the word line layer 404*d*. A dielectric layer 406 can be formed along the steps 412, 414, 416, and 418 and function as an etch stop layer. The dielectric layer 406 can be made of SiN that is doped with one or a combination of carbon, phosphorous, boron, arsenic, and oxygen. Further, a plurality of word line contacts 410*a*-410*c* can be formed in an ILD layer 408. The word line contacts 410*a*-410*c* can extend from the word line layers 404*a*-404*d* at the steps 412, 414, 416, and 418 in a direction perpendicular to the substrate (e.g., Z-direction), and further extend through the dielectric layer 406.

Figure 5:
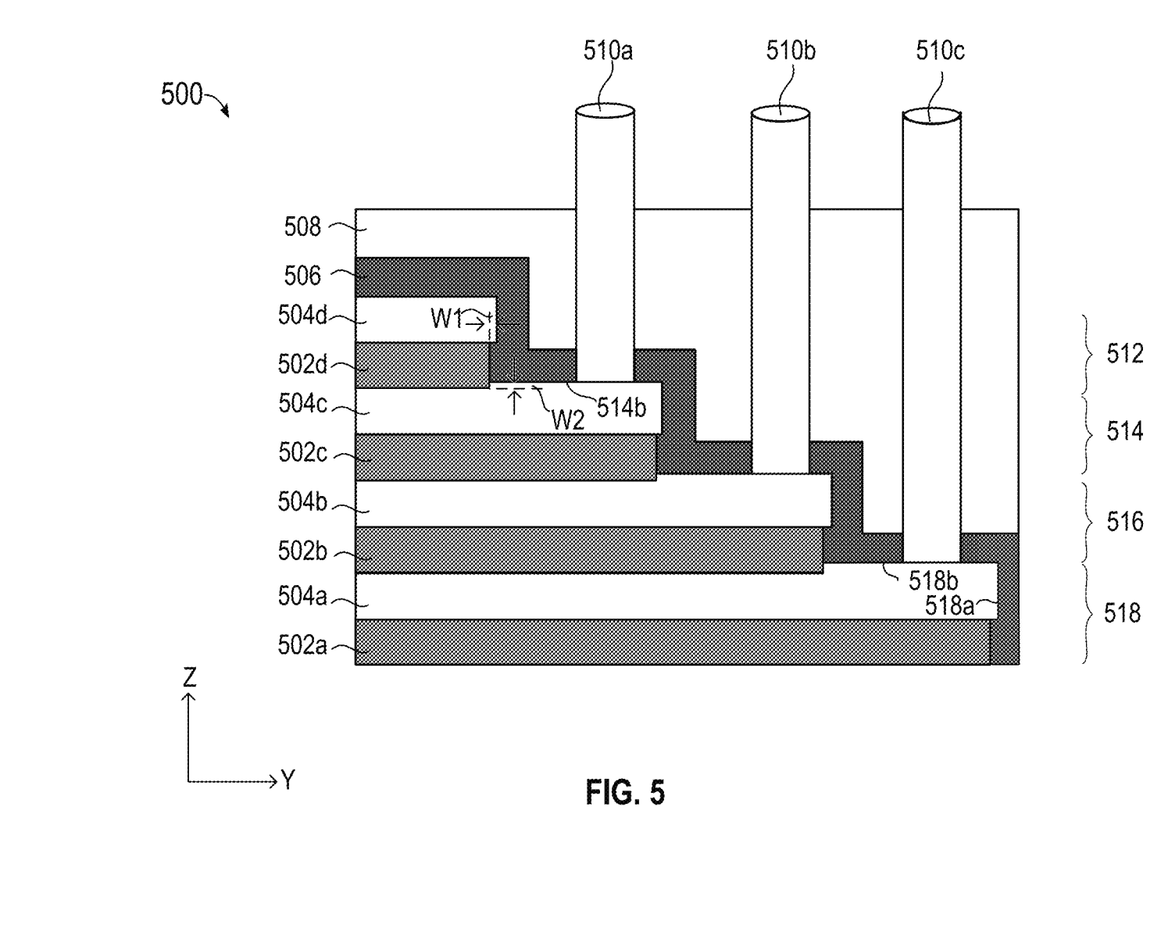
FIG. 5 is a cross-sectional view of a second exemplary staircase region of a 3D-NAND memory device, in accordance with exemplary embodiments of the disclosure.

FIG. 5 is a cross-sectional view of a second exemplary staircase region 500 of a 3D-NAND memory device, which can be formed based on the manufacturing process in FIGS. 3A-3D. As shown in FIG. 5, the staircase region 500 can be formed in a stack of alternating insulating layers 502*a*-502*d* and word line layers 504*a*-504*d* and include a plurality of steps 512, 514, 516, and 518. Each of the plurality of steps 512, 514, 516, and 518 can include a respective pair of an insulating layer and a word line layer, and a tread and a riser. For example, the step 518 can include a tread 518*b* and a riser 518*a* that are formed in the insulating layer 502*a* and the word line layer 504*a*. A dielectric layer 506 can be formed along the steps 512-518 and function as an etch stop layer. The dielectric layer 506 can be made of SiN that is doped with one or a combination of carbon, phosphorous, boron, arsenic, and oxygen. Further, a plurality of word line contacts 510*a*-510*c* can be formed in an ILD layer 508. The word line contacts 510*a*-510*c* can extend from the word line layers 504*a*-504*d* at the treads of the steps 512-518 in a direction perpendicular to the substrate (e.g., Z-direction), and further extend through the dielectric layer 506. For example, the word line contact 510*c* can extend from the word line layer 504*a* that is positioned at the tread 518*b* of the step 518.

In order to form the staircase region 500, when the sacrificial layers (e.g., 304*a*-304*b*) are removed by an wet etch, the wet acid, the concentration of the wet acid, or the etching time of the wet etch can be tuned so that the sacrificial layers and a portion of the dielectric layer 506 that is in contact with the sacrificial layers can be removed to form spaces between the insulating layers. The conductive material can subsequently be filled in the spaces to form the word line layers that are illustrated in FIG. 5.

Compared to the staircase region 400, the staircase region 500 can have different features. For example, in each of the steps 512, 514, 516, and 518, the word line layers 504*a*-504*d* can extend further into the dielectric layer 506 than the insulating layer 502*a*-502*d* in a direction parallel to the substrate (e.g., Y-direction). In addition, a portion of the word line layer covered by an overlying insulating layer of the stack has a smaller thickness than a portion of the word line layer at the tread. For example, the word line layer 504*d* in the step 512 can extend further into the dielectric layer 506 by W1. The W1 can be in a range from 5 nm to 100 nm. The portion of the word line layer 504*c* covered by the overlying insulating layer 502*d* can have a smaller thickness than the portion of the word line layer 504*c* at the tread 514*d* of the step 514 by W2. The W2 can be in a range from 5 nm to 100 nm.

Figure 6:
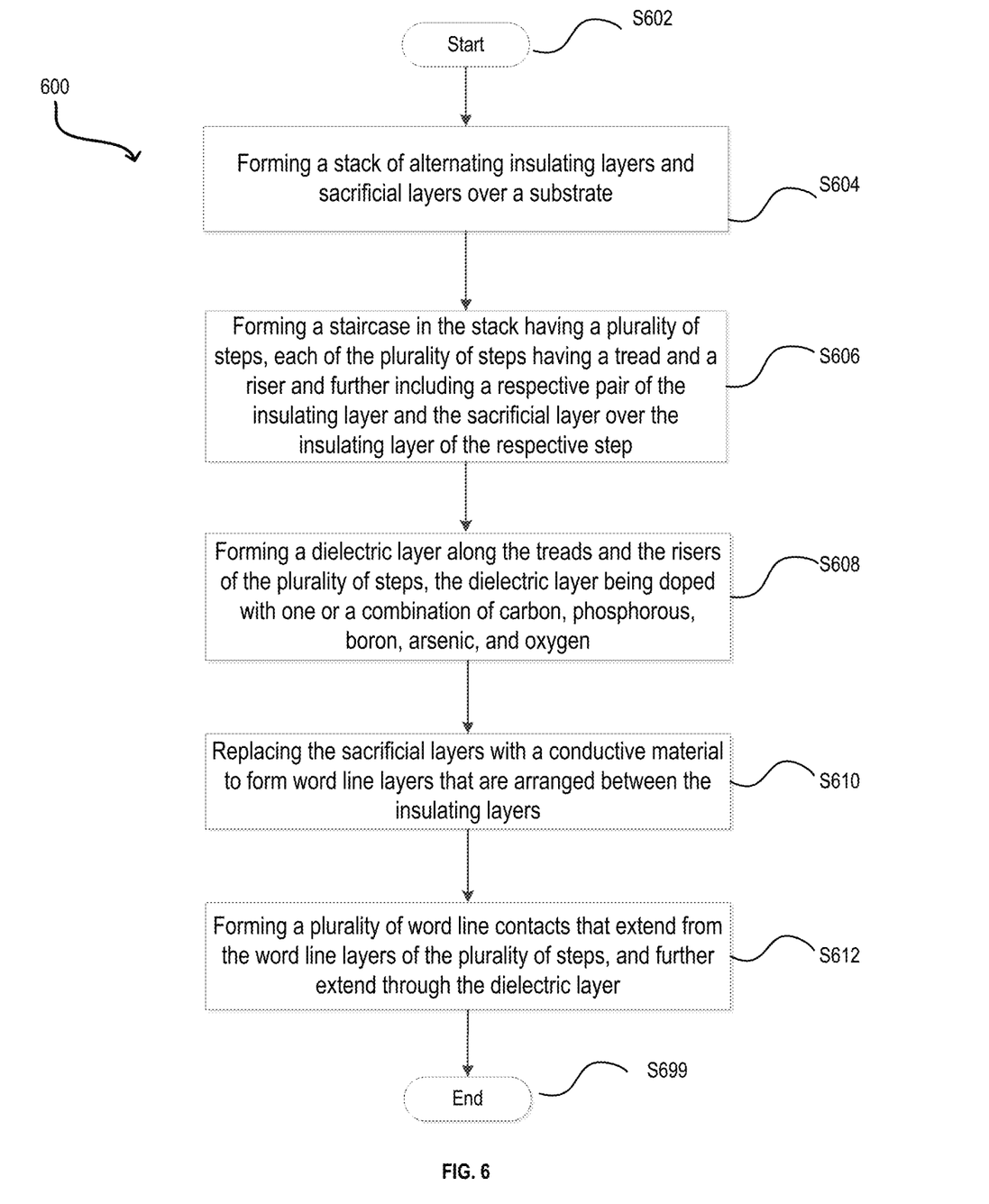
FIG. 6 is a flowchart of a process for manufacturing a staircase region of a 3D-NAND memory device, in accordance with exemplary embodiments of the disclosure.

FIG. 6 is a flowchart of a process 600 for manufacturing the disclosed 3D-NAND memory device in accordance with some embodiments of the present disclosure. The process 600 begins at step S602, and then proceeds to S604. At S604, a stack of alternating insulating layers and sacrificial layers can be formed over a substrate. In order to form the stack of alternating insulating layers and sacrificial layers, the insulating layers that includes SiO and the sacrificial layers that includes SiN can be deposited alternatingly on the substrate so that the sacrificial layers are disposed between the insulating layers.

The process 600 then proceeds to S606. At S606, a staircase having a plurality of steps can be formed in the stack, where each of the plurality of steps can have a tread and a riser and further includes a respective pair of the insulating layer and the sacrificial layer over the insulating layer of the respective step. In some embodiments, the steps S604 and S606 can be performed as illustrated with reference to FIG. 3A.

At S608, a dielectric layer can be formed along the treads and risers of the plurality of steps. The dielectric layer can be doped with one or a combination of carbon, phosphorous, boron, arsenic, and oxygen. In some embodiments, the step S608 can be performed as illustrated with reference to FIG. 3B.

In some embodiments, in order to form the dielectric layer, a SiN layer can be formed. The SiN layer can be doped with the one or the combination of carbon, phosphorous, boron, arsenic, and oxygen.

In some embodiments, in order to form the dielectric layer, a SiN layer can be formed. The SiN layer can be doped with carbon by processing gases including tetramethylsilane and $NH_3$.

In some embodiments, in order to form the dielectric layer, a SiN layer can be formed. The SiN layer can be doped with oxygen by processing gases including $SiH_4$ and $N_2O$.

At S610, the sacrificial layers can further be replaced with a conductive material to form word line layers that are arranged between the insulating layers. In some embodiments, the step S610 can be performed as illustrated with reference to FIG. 3C.

In an example, in order to replace the sacrificial layers, the sacrificial layers can be removed by an etching process, where the dielectric layer can have a lower etch rate than the sacrificial layers in the etching process.

In an example, in order to replace the sacrificial layers, the sacrificial layers can be removed to form spaces between the insulating layers. The conductive material can further be filled in the spaces to form the word line layers between the insulating layers.

In another example, in order to replace the sacrificial layers, the sacrificial layers and a portion of the dielectric layer that is in contact with the sacrificial layers can be removed to form spaces between the insulating layers. The conductive material can subsequently be filled in the spaces to form the word line layers between the insulating layers.

In some embodiments, in each of the plurality of steps, the word line layer can extend further into the dielectric layer than the insulating layer in a direction parallel to the substrate, and a portion of the word line layer covered by the insulating layer of an overlying step of the plurality of steps can have a smaller thickness than a portion of the word line layer at the tread.

At S612, a plurality of word line contacts can be formed to extend from the word line layers of the plurality of steps, and further extend through the dielectric layer. In the method, each of the plurality of word line contacts can extend from a respective word line layer at the treads of the plurality of steps, and further extend through the dielectric layer in a direction perpendicular to the substrate. In some embodiments, the step S612 can be performed as illustrated with reference to FIG. 3D.

It should be noted that additional steps can be provided before, during, and after the process 600, and some of the steps described can be replaced, eliminated, or performed in different order for additional embodiments of the process 600. For example, before the sacrificial layers are replaced with word line layers, channel structures can be formed in the array region of the initial stack. In addition, when the sacrificial layers are replaced with word line layers, slit structures can further be formed. Moreover, various additional interconnect structures (e.g., metallization layers having conductive lines and/or vias) may be formed over the word line contacts of the 3D-NAND memory device. Such interconnect structures electrically connect the 3D-NAND memory device with other contact structures and/or active devices to form functional circuits. Additional device features such as passivation layers, input/output structures, and the like may also be formed.

The various embodiments described herein offer several advantages over methods in related examples to fabricating a 3D-NAND memory device. In order to prevent the word line contacts from punching through the word line layers at the steps of the staircase region, in related examples, a high standard is required to control the selective formation of the dielectric layer, which in turn brings more challenges and difficulties to subsequent manufacturing processes. In the present disclosure, a doped dielectric layer is formed along the steps of the staircase region to function as one or more etch stop layers to prevent the word line contacts from punching through the word line layers at the steps. Accordingly, it can be much easier to control the manufacturing process of forming the word line contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
    forming a stack of alternating insulating layers and sacrificial layers over a substrate;
    forming a staircase in the stack having a plurality of steps, each of the plurality of steps having a tread and a riser and further including a respective pair of the insulating layer and the sacrificial layer over the insulating layer of the respective step;
    forming a dielectric layer along the treads and the risers of the plurality of steps, the dielectric layer being doped with one or a combination of carbon, phosphorous, boron, arsenic, and oxygen;
    replacing the sacrificial layers with a conductive material to form word line layers that are arranged between the insulating layers; and
    forming a plurality of word line contacts that extend from the word line layers of the plurality of steps, and further extend through the dielectric layer,
    wherein
    the word line contacts do not extend into the word line layers of the plurality of steps,
    the word line contacts do not extend through the insulating layers, or
    the replacing the sacrificial layers further comprises removing the sacrificial layers and a portion of the dielectric layer that is in contact with the sacrificial layers to form spaces between the insulating layers, and filling the conductive material in the spaces to form the word line layers between the insulating layer, wherein in each of the plurality of steps, the word line layer extends further into the dielectric layer than the insulating layer in a direction parallel to the substrate, and a portion of the word line layer covered by the insulating layer of an overlying step of the plurality of steps has a smaller thickness than a portion of the word line layer at the tread.

2. The method of claim 1, wherein the replacing the sacrificial layers further comprises:
    removing the sacrificial layers to form spaces between the insulating layers; and
    filling the conductive material in the spaces to form the word line layers between the insulating layers.

3. The method of claim 1, wherein the replacing the sacrificial layers further comprises:
    removing the sacrificial layers and the portion of the dielectric layer that is in contact with the sacrificial layers to form the spaces between the insulating layers; and
    filling the conductive material in the spaces to form the word line layers between the insulating layers,
    wherein in each of the plurality of steps:
    the word line layer extends further into the dielectric layer than the insulating layer in the direction parallel to the substrate, and
    the portion of the word line layer covered by the insulating layer of the overlying step of the plurality of steps has the smaller thickness than the portion of the word line layer at the tread.

4. The method of claim 1, wherein the forming the dielectric layer further comprises:
    forming a SiN layer that is doped with the one or the combination of carbon, phosphorous, boron, arsenic, and oxygen.

5. The method of claim 1, wherein the forming the dielectric layer further comprises:
    forming a SiN layer that is doped with carbon by processing gases including tetramethylsilane and $NH_3$.

6. The method of claim 1, wherein the forming the dielectric layer further comprises:
    forming a SiN layer that is doped with oxygen by processing gases including $SiH_4$ and $N_2O$.

7. The method of claim 1, wherein each of the plurality of word line contacts extends from a respective word line layer at the treads of the plurality of steps, and further extends through the dielectric layer in a direction perpendicular to the substrate.

8. The method of claim 1, wherein the replacing the sacrificial layers further comprises:
    removing the sacrificial layers by an etching process, the dielectric layer having a lower etch rate than the sacrificial layers in the etching process.

9. The method of claim 1, wherein the forming the stack of alternating insulating layers and sacrificial layers further comprises:

depositing the insulating layers that include SiO and the sacrificial layers that include SiN alternatingly on the substrate so that the sacrificial layers are disposed between the insulating layers.

10. The method of claim 1, wherein the word line contacts do not extend into the word line layers of the plurality of steps.

11. The method of claim 1, wherein the word line contacts do not extend through the insulating layers.

12. A method for fabricating a semiconductor device, comprising:
forming a stack of alternating oxide layers and first nitride layers over a substrate;
etching the stack to form a staircase having a plurality of steps in the stack, each of the plurality of steps having a tread and a riser and further including a respective pair of the oxide layer and the nitride layer over the oxide layer of the respective step;
forming a second nitride layer along the treads and the risers of the plurality of steps, the second nitride layer being doped with one or a combination of carbon, phosphorous, boron, arsenic, and oxygen;
removing the first nitride layers by an etching process to form spaces between the oxide layers, and filling the spaces with a conductive material to form word line layers that are arranged between the oxide layers; and
forming a plurality of word line contacts that extend from the word line layers of the plurality of steps, and further extend through the second nitride layer,
wherein
the word line contacts do not extend into the word line layers of the plurality of steps,
the word line contacts do not extend through the insulating layers, or
the removing the first nitride layers further comprises removing the first nitride layers and a portion of the second nitride layer that is in contact with the first nitride layers to form the spaces between the oxide layers, wherein in each of the plurality of steps, the word line layer extends further into the second nitride layer than the oxide layer in a direction parallel to the substrate, and a portion of the word line layer covered by the insulating layer of an overlying step of the plurality of steps has a smaller thickness than a portion of the word line layer at the tread.

13. The method of claim 12, wherein the removing the first nitride layers further comprises:
removing the first nitride layers and the portion of the second nitride layer that is in contact with the first nitride layers to form the spaces between the oxide layers,
wherein in each of the plurality of steps:
the word line layer extends further into the second nitride layer than the oxide layer in the direction parallel to the substrate, and
the portion of the word line layer covered by the insulating layer of the overlying step of the plurality of steps has the smaller thickness than a portion of the word line layer at the tread.

14. The method of claim 12, wherein the forming the second nitride layer further comprises one of:
forming a SiN layer that is doped with carbon by processing gases including tetramethylsilane and $NH_3$, and
forming a SiN layer that is doped with oxygen by processing gases including $SiH_4$ and $N_2O$.

15. The method of claim 12, wherein the forming the second nitride layer further comprises one of:
forming a SiN layer that is doped with arsenic.

16. The method of claim 12, wherein each of the plurality of word line contacts extends from a respective word line layer at the treads of the plurality of steps, and further extends through the second nitride layer in a direction perpendicular to the substrate.

17. The method of claim 12, wherein the word line contacts do not extend into the word line layers of the plurality of steps.

18. The method of claim 12, wherein the word line contacts do not extend through the insulating layers.

* * * * *